United States Patent
Oh et al.

(10) Patent No.: US 7,635,633 B2
(45) Date of Patent: Dec. 22, 2009

(54) NON-VOLATILE MEMORY DEVICE AND METHOD OF MANUFACTURING THE SAME

(75) Inventors: Se-Hoon Oh, Hwaseong-si (KR); Young-Geun Park, Suwon-si (KR); Han-Mei Choi, Seoul (KR); Seung-Hwan Lee, Suwon-si (KR); Ki-Yeon Park, Seoul (KR); Sun-Jung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 157 days.

(21) Appl. No.: 11/898,039

(22) Filed: Sep. 7, 2007

(65) Prior Publication Data

US 2008/0061360 A1     Mar. 13, 2008

(30) Foreign Application Priority Data

Sep. 8, 2006     (KR) ............... 10-2006-0086593

(51) Int. Cl.
*H01L 21/336* (2006.01)

(52) U.S. Cl. ............... 438/288; 438/216; 438/591

(58) Field of Classification Search ......... 438/216, 438/288, 591
See application file for complete search history.

(56) References Cited

U.S. PATENT DOCUMENTS

| | | | |
|---|---|---|---|
| 6,627,498 B2 | 9/2003 | Willer et al. | |
| 7,405,441 B2 * | 7/2008 | Deppe et al. | 257/314 |
| 7,446,371 B2 * | 11/2008 | Kim | 257/321 |
| 2005/0239248 A1 | 10/2005 | Lee | |

FOREIGN PATENT DOCUMENTS

JP     2004-311803     11/2004

* cited by examiner

*Primary Examiner*—Douglas M Menz
(74) *Attorney, Agent, or Firm*—Harness, Dickey & Pierce, P.L.C.

(57) ABSTRACT

In a non-volatile memory device and a method of manufacturing the non-volatile memory device, a tunnel insulating layer, a charge trapping layer, a dielectric layer and a conductive layer may be sequentially formed on a channel region of a substrate. The conductive layer may be patterned to form a gate electrode and spacers may be formed on sidewalls of the gate electrode. A dielectric layer pattern, a charge trapping layer pattern, and a tunnel insulating layer pattern may be formed on the channel region by an anisotropic etching process using the spacers as an etch mask. Sidewalls of the charge trapping layer pattern may be removed by an isotropic etching process to reduce the width thereof. Thus, the likelihood of lateral diffusion of electrons may be reduced or prevented in the charge trapping layer pattern and high temperature stress characteristics of the non-volatile memory device may be improved.

10 Claims, 4 Drawing Sheets

NON-VOLATILE MEMORY DEVICE AND METHOD OF MANUFACTURING THE SAME

PRIORITY STATEMENT

This application claims priority under 35 USC § 119 to Korean Patent Application No. 2006-0086593, filed on Sep. 8, 2006, in the Korean Intellectual Property Office (KIPO), the entire contents of which are herein incorporated by reference.

BACKGROUND

1. Field

Example embodiments relate to a non-volatile memory device including a charge trapping layer and a method of manufacturing the non-volatile memory device.

2. Description of Related Art

In general, semiconductor memory devices are classified as either volatile or non-volatile semiconductor memory devices. Volatile semiconductor memory devices (e.g., dynamic random access memory (DRAM) devices and static random access memory (SRAM) devices) have a relatively high response speed. However, the volatile semiconductor memory devices lose stored data when power is discontinued. On the other hand, although non-volatile semiconductor memory devices (e.g., electrically erasable programmable read only memory (EEPROM) devices and flash memory devices) have a relatively slow response speed, non-volatile semiconductor memory devices are able to maintain stored data even when power is discontinued.

In EEPROM devices, data is electrically stored (e.g., programmed or erased) through a Fowler-Nordheim (F-N) tunneling mechanism and/or a channel hot electron injection mechanism. The flash memory device is classified as either a floating gate type or a charge trap type (e.g., silicon-oxide-nitride-oxide semiconductor (SONOS) type devices and metal-oxide-nitride-oxide semiconductor (MONOS) type devices).

The SONOS or MONOS type non-volatile memory device includes a tunnel insulating layer formed on a channel region of a semiconductor substrate, a charge trapping layer for trapping electrons from the channel region, a dielectric layer formed on the charge trapping layer, a gate electrode formed on the dielectric layer, spacers formed on sidewalls of the gate electrode and source/drain regions formed at surface portions of the semiconductor substrate adjacent to the channel region.

When thermal stress is applied to the charge trap type non-volatile memory device, electrons trapped in the charge trapping layer may be laterally diffused, thereby deteriorating high temperature stress (HTS) characteristics of the non-volatile memory device. For example, when the non-volatile memory device is maintained at a temperature of about 200° C. for about 2 hours, the threshold voltage of the non-volatile memory device may be reduced. For example, when programming and erasing operations of the non-volatile memory device are repeatedly performed about 1000 to 1200 times and the non-volatile memory device is maintained at a temperature of about 200° C. for about 2 hours, the threshold voltage of the non-volatile memory device may be increasingly reduced.

SUMMARY

Example embodiments provide a non-volatile memory device having improved HTS characteristics and a method of manufacturing the non-volatile memory device having HTS characteristics.

A non-volatile memory device according to example embodiments may include a tunnel insulating layer pattern on a channel region of a substrate, a charge trapping layer pattern on the tunnel insulating layer pattern to trap electrons from the channel region, a dielectric layer pattern on the charge trapping layer pattern, a gate electrode on the dielectric layer pattern, and spacers on sidewalls of the gate electrode. The charge trapping layer pattern may have a width smaller than the distance between outer surfaces of the spacers.

The width of the charge trapping layer pattern may be smaller than the width of the tunnel insulating layer pattern and also smaller than the width of the dielectric layer pattern.

The width ratio of the charge trapping layer pattern to the gate electrode may be about 0.7 to about 1.1. For example, the width of the charge trapping layer pattern may be substantially the same as that of the gate electrode.

The charge trapping layer pattern may be a silicon nitride layer pattern.

Examples of the charge trapping layer pattern may include a metal oxide layer pattern, a metal oxynitride layer pattern, a metal silicon oxide layer pattern, a metal silicon oxynitride layer pattern, and similar. Examples of a metal that may be used for the charge trapping layer pattern may include hafnium (Hf), zirconium (Zr), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), and similar. These metals may be used alone or in a combination thereof.

The gate electrode may have a multi-layered structure including a first metal nitride layer pattern, a second metal nitride layer pattern, and a metal layer pattern.

The dielectric layer pattern may be an aluminum oxide layer pattern.

In a method of manufacturing a non-volatile memory device according to example embodiments, a tunnel insulating layer, a charge trapping layer, a dielectric layer, and a conductive layer may be sequentially formed on a channel region of a substrate, and the conductive layer may then be patterned to form a gate electrode. Spacers may be formed on sidewalls of the gate electrode and the dielectric layer, the charge trapping layer, and the tunnel insulating layer may then be etched using the spacers as an etch mask to form a dielectric layer pattern, a charge trapping layer pattern, and a tunnel insulating layer pattern on the channel region. Sidewalls of the charge trapping layer pattern may be etched to reduce the width thereof.

The ratio of the reduced width of the charge trapping layer pattern to the width of the gate electrode may be about 0.7 to about 1.1. For example, the reduced width of the charge trapping layer pattern may be substantially the same as the width of the gate electrode.

The charge trapping layer may include silicon nitride. The sidewalls of the charge trapping layer pattern may be removed by an etchant including phosphoric acid and water or an etchant comprising sulfuric acid and water.

The charge trapping layer may include a material having a dielectric constant higher than that of silicon nitride. Examples of a material that may be used for the charge trapping layer may include metal oxide, metal oxynitride, metal silicon oxide, metal silicon oxynitride, and similar. Examples of a metal that may be used for the charge trapping layer may include hafnium (Hf), zirconium (Zr), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), and similar. These metals may be used alone or in a combination thereof. The sidewalls of the charge trapping layer pattern may be removed by an etchant including hydrogen fluoride and water.

The dielectric layer may include aluminum oxide.

The charge trapping layer pattern may have a reduced width. Because regions in which electrons trapped in the charge trapping layer pattern may be diffused are removed, the likelihood of lateral diffusion of electrons may be reduced or prevented in the charge trapping layer pattern. As a result, HTS characteristics and reliability of the non-volatile memory device may be improved.

BRIEF DESCRIPTION OF THE DRAWINGS

Example embodiments will be more clearly understood from the following detailed description taken in conjunction with the accompanying drawings.

FIG. 1 is a cross-sectional view illustrating a non-volatile memory device according to example embodiments; and FIGS. 2 to 7 are cross-sectional views illustrating a method of manufacturing the non-volatile memory device illustrated in FIG. 1.

DETAILED DESCRIPTION OF EXAMPLE EMBODIMENTS

Figure 1:
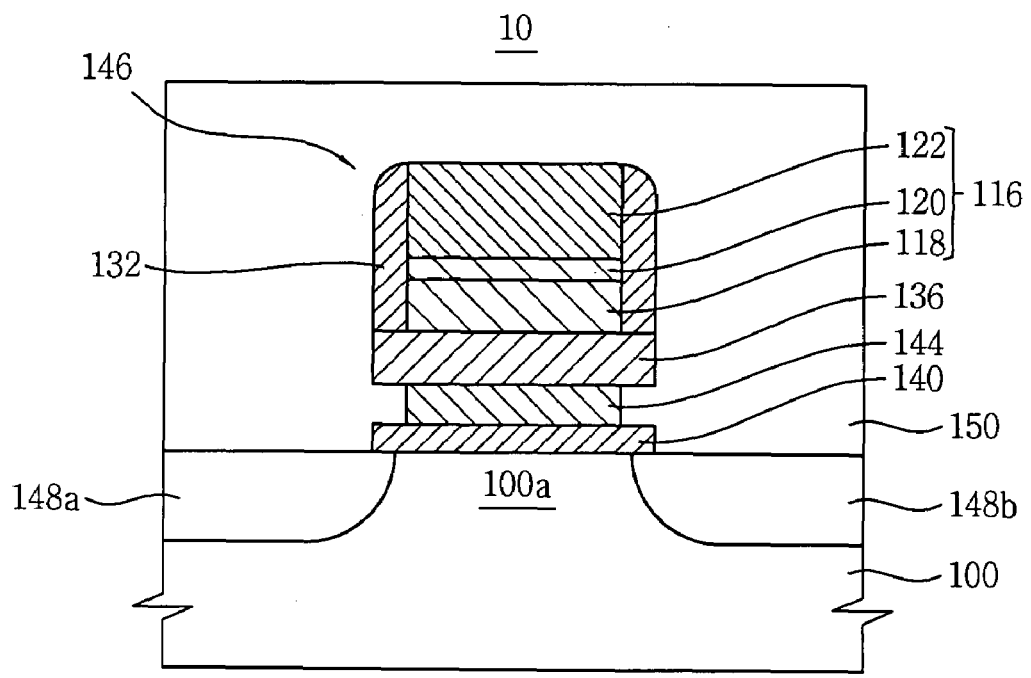
FIGS. 1-7 represent non-limiting, example embodiments as described herein.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms: These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a cross-sectional view illustrating a non-volatile memory device according to example embodiments.

Referring to FIG. 1, a non-volatile memory device 10 may include a semiconductor substrate 100 having a channel region 100a, a gate structure 146, source/drain regions 148a and 148b, and an insulating layer 150 formed on the gate structure 146, and source/drain regions 148a and 148b.

A silicon wafer may be used as the semiconductor substrate 100 and the gate structure 146 may be formed on the channel region 100a.

The gate structure 146 may include a control gate electrode 116, spacers 132 formed on sidewalls of the control gate electrode 116, a dielectric layer pattern 136 used as a blocking layer pattern, a charge trapping layer pattern 144, and a tunnel insulating layer pattern 140.

The control gate electrode 116 may have a multi-layered structure. For example, the control gate electrode 116 may include a first metal nitride layer pattern 118 that may be used as a metal barrier layer, a second metal nitride layer pattern 120 that may be used as an adhesion layer, and a metal layer pattern 122 that may be used as a signal line. Examples of the first metal nitride layer pattern 118 may include a tantalum nitride layer pattern, a titanium nitride layer pattern, a hafnium nitride layer pattern, and similar, and may be used as a substantial gate electrode. An example of the second metal nitride layer pattern 120 may be a tungsten nitride layer pattern. Examples of the metal layer pattern 122, which may be used as a substantial word line, may include a tungsten layer pattern and a metal silicide layer pattern. Examples of the metal silicide layer pattern may include a tungsten silicide layer pattern, a tantalum silicide layer pattern, a cobalt silicide layer pattern, a titanium silicide layer pattern, and similar.

The spacers 132 may include silicon oxide, and may be provided to improve the structural stability of the control gate electrode 116 and to electrically isolate the control gate electrode 116 from adjacent structures (e.g., contact plugs, contact pads, and/or similar).

The dielectric layer pattern 136 may be used to provide electrical isolation between the control gate electrode 116 and the charge trapping layer pattern 144. An aluminum oxide layer pattern may be used as the dielectric layer pattern 136.

The charge trapping layer pattern 144 may serve as a data storage layer. For example, the charge trapping pattern 144 may be provided to trap electrons from the channel region 100a. A silicon nitride layer pattern may be used as the charge trapping layer pattern 144.

The charge trapping layer pattern 144 may include a material having a dielectric constant k higher than that of silicon nitride. Examples of the charge trapping layer pattern 144 may include a metal oxide layer pattern, a metal oxynitride layer pattern, a metal silicon oxide layer pattern, a metal silicon oxynitride layer pattern, and similar. Examples of a metal that may be used for the charge trapping layer pattern 144 may include hafnium (Hf), zirconium (Zr), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), and etc. The afore-mentioned may be used alone or in a combination thereof.

The tunnel insulating layer pattern 140 may include a silicon oxide layer pattern, which may be formed by a thermal oxidation process.

The non-volatile memory device 10 may serve as a single level cell (SLC) or a multi-level cell (MLC) and may perform electrical programming and erasing using the F-N tunneling mechanism and/or the channel hot electron injection mechanism.

When the non-volatile memory device 10 serves as the SLC, one bit of data may be stored in the charge trapping layer pattern 144. For example, a logic state of "0" or "1" (e.g., a binary value of "0" or "1") may be stored in the charge trapping layer pattern 144.

When a programming voltage of about 5V to about 18V is applied to the control gate electrode 116, electrons from the channel region 100a of the semiconductor substrate 100 may be trapped in the charge trapping layer pattern 144 using the F-N tunneling mechanism. Accordingly, a logic stage of "1" may be stored in the charge trapping layer pattern 144. The threshold voltage in the channel region 100a may vary according to the logic state stored in the charge trapping layer pattern 144. The logic state may be read by applying reading voltages to the control gate electrode 116 and the drain region 148b and/or by detecting the current in the channel region 100a.

When the non-volatile memory device 10 serves as the MLC, a logic stage of "00," "01," "10," or "11" may be stored in the charge trapping layer pattern 144.

The non-volatile memory device 10 may have threshold voltages different from one another based upon the number of electrons trapped in the charge trapping layer pattern 144, and the logic state of the non-volatile memory device 10 may be determined by the threshold voltages.

When the non-volatile memory device 10 is used as the MLC, it may be desirable that the threshold voltage window of the non-volatile memory device 10 is more than about 6V. Improved HTS characteristics may be necessary to ensure the wide threshold voltage window as mentioned above. Because the charge trapping layer pattern of a conventional non-volatile memory device may have a wider width, when a high thermal stress is applied to the conventional non-volatile memory device, electrons may diffuse laterally in the charge trapping layer pattern of the device, and thus, HTS characteristics of the conventional non-volatile memory device may be deteriorated.

The charge trapping layer pattern 144 may have a width smaller than the distance between the outer surfaces of the spacers 132 such that the likelihood of lateral diffusion of electrons may be reduced or prevented in the charge trapping layer pattern 144. Further, because the insulating layer 150 may be formed on the gate structure 146, the likelihood of lateral diffusion of the trapped electrons may be reduced or prevented. For example, a width ratio of the charge trapping layer pattern 144 to the control gate electrode 116 may be about 0.7 to about 1.1. For example, the width of the charge trapping layer pattern 144 may be substantially the same as that of the control gate electrode 116.

The charge trapping layer pattern 144 may have a width smaller than that of the tunnel insulating layer pattern 140. Also, the charge trapping layer pattern 144 may have a width smaller than that of the dielectric layer pattern 136.

Electrons may be trapped in the charge trapping layer pattern 144 by the channel hot electron injection mechanism. When the programming voltages are applied to the control gate electrode 116 and the drain region 148b, and the source region 148a is grounded, electrons may move from the source region 148a toward the drain region 148b through the channel region 100a. Some of the electrons may have sufficient energy to overcome the potential barrier of the tunnel insulating layer pattern 140, and may be trapped in trap sites of the charge trapping layer pattern 144. Consequently, the threshold voltage of the non-volatile memory device 10 may be increased, and thus, one bit of data may be stored in the non-volatile memory device 10.

FIGS. 2 to 7 are cross-sectional views illustrating a method of manufacturing the non-volatile memory device 10 illustrated in FIG. 1.

Figure 2:
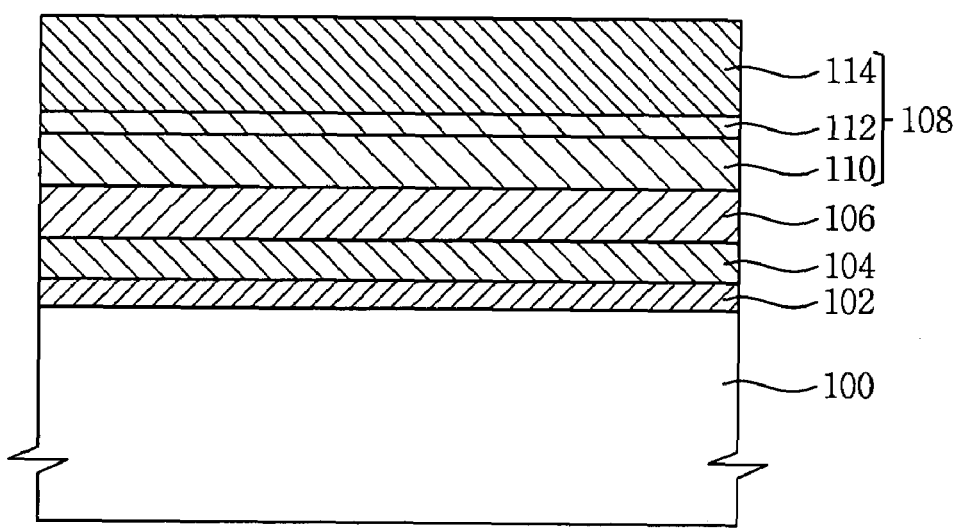

Referring to FIG. 2, an isolation layer (not shown) may be formed to define an active region in the surface portion of a semiconductor substrate 100, for example, a silicon wafer. The isolation layer may be formed in the surface portion of the semiconductor substrate 100 by a local oxidation of silicon (LOCOS) or a shallow trench isolation (STI) process.

A tunnel insulating layer 102, a charge trapping layer 104, a dielectric layer 106, and a conductive layer 108 may be sequentially formed on the semiconductor substrate 100.

The tunnel insulating layer 102 may include silicon oxide ($SiO_2$) and may be formed to a thickness of about 20 Å to about 80 Å using a thermal oxidation process. For example, the tunnel insulating layer 102 may be formed to a thickness of about 35 Å on the semiconductor substrate 100.

The charge trapping layer 104 may be formed to trap electrons from a channel region of the semiconductor substrate 100. The charge trapping layer 104 may include silicon nitride and may be formed to a thickness of about 20 Å to about 100 Å on the tunnel insulating layer 102. For example, the charge trapping layer 104 may be formed to a thickness of about 70 Å using a low pressure chemical vapor deposition (LPCVD) process.

The charge trapping layer 104 may include a high-k material having a dielectric constant k higher than that of silicon nitride. Examples of the high-k material may include metal oxide, metal oxynitride, metal silicon oxide, metal silicon oxynitride, and similar. These high-k materials may be used alone or in a combination thereof. Examples of a metal that may be used for the high-k material may include hafnium (Hf), zirconium (Zr), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), etc. These metals may be used alone or in a combination thereof.

The dielectric layer 106 may serve as a blocking layer which may provide electrical isolation between the charge trapping layer 104 and the conductive layer 108. The dielectric layer 106 may include aluminum oxide ($Al_2O_3$) and may be formed by a chemical vapor deposition (CVD) process or an atomic layer deposition (ALD) process. The dielectric layer 106 may be formed to a thickness of about 100 Å to about 400 Å on the charge trapping layer 104. For example, the dielectric layer 106 may be formed to a thickness of about 200 Å on the charge trapping layer 104.

The conductive layer 108 may include a first metal nitride layer 110, a second metal nitride layer 112, and a metal layer 114.

The first metal nitride layer 110 may serve as a metal barrier layer and/or a gate layer. The first metal nitride layer 110 may include tantalum nitride, titanium nitride, hafnium nitride, and similar. For example, the first metal nitride layer 110 may include tantalum nitride and may be formed to a thickness of about 200 Å on the dielectric layer 106.

The second metal nitride layer 112 may serve as an adhesion layer and may include tungsten nitride. The second metal nitride layer 112 may be formed to a thickness of about 50 Å on the first metal nitride layer 110.

The metal layer 114 may include tungsten and may be formed to a thickness of about 300 Å on the second metal nitride layer 112. Alternatively, the metal layer 114 may include metal silicide. Examples of the metal silicide may include tungsten silicide, tantalum silicide, cobalt silicide, titanium silicide, and similar.

Figure 3:
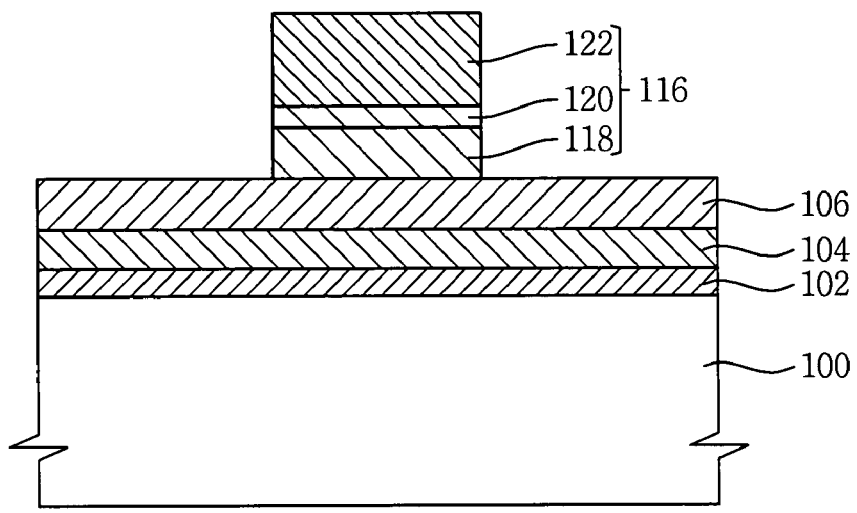

Referring to FIG. 3, a photoresist pattern may be formed on the conductive layer 108 using a photolithography process well-known to those skilled in the art.

The conductive layer 108 may be patterned to form a control gate electrode 116 including a first metal nitride layer pattern 118, a second metal nitride layer pattern 120 and a metal layer pattern 122 on the dielectric layer 106. An anisotropic etching process using the photoresist pattern as an etch mask may be performed to form the control gate electrode 116.

The photoresist pattern may be removed by an ashing process and/or a stripping process after forming the control gate electrode 116.

Figure 4:
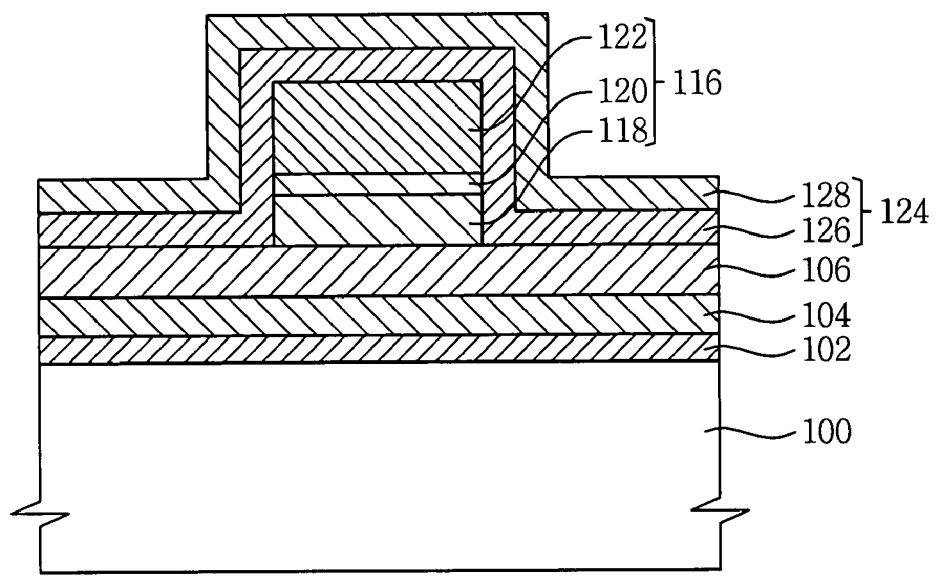

Referring to FIG. 4, a spacer layer 124 may be formed on the control gate electrode 116 and the dielectric layer 106. The spacer layer 124 may include a silicon oxide layer 126 and a silicon nitride layer 128. The silicon oxide layer 126 may be formed on the control gate electrode 116 and the blocking layer 106 and the silicon nitride layer 128 may be then formed on the silicon oxide layer 126. The silicon oxide layer 126 and the silicon nitride layer 128 may be formed using a CVD process. Alternatively, the silicon oxide layer 126 and the silicon nitride layer 128 may be formed in the same chamber using an in-situ process.

Figure 5:
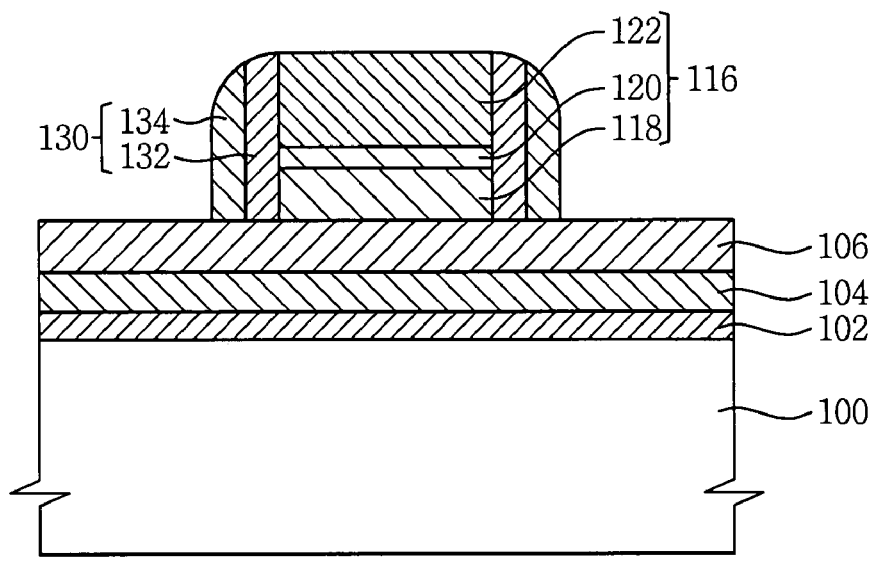

Referring to FIG. 5, dual spacers 130 may be formed on sidewalls of the control gate electrode 116 by anisotropically etching the spacer layer 124. The dual spacers 130 may include silicon oxide spacers 132 and silicon nitride spacers 134. In addition, spacers having a single layered structure may be formed on the sidewalls of the control gate electrode 116. In such case, the spacers may be silicon oxide spacers or silicon nitride spacers.

Figure 6:
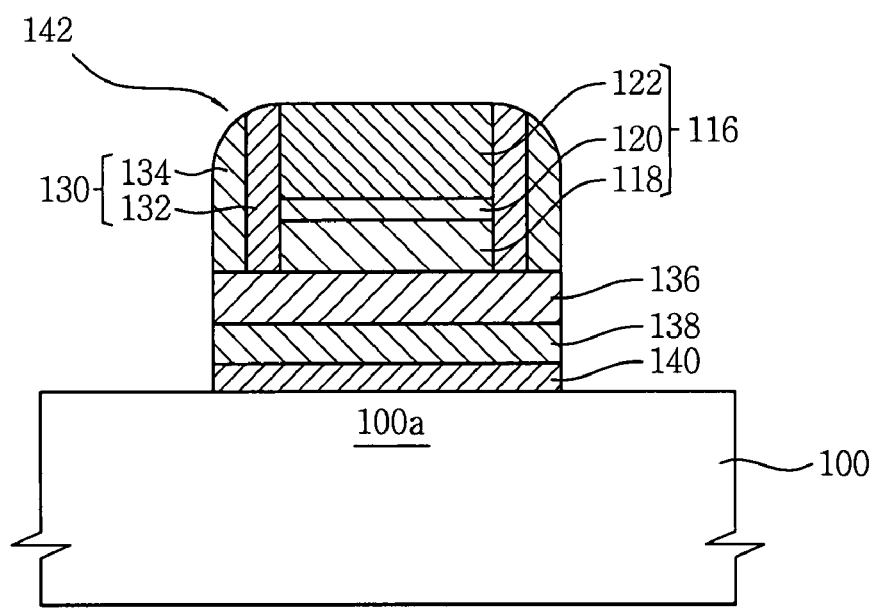

Referring to FIG. 6, a dielectric layer pattern 136, a preliminary charge trapping layer pattern 138, and a tunnel insulating layer pattern 140 may be formed by performing an anisotropic etching process using the control gate electrode 116 and the dual spacers 130 as etch masks on the dielectric layer 106, the charge trapping layer 104, and the tunnel insulating layer 102.

A preliminary gate structure 142, which may include the gate electrode 116, the dual spacers 130, the dielectric layer pattern 136, the preliminary charge trapping layer pattern 138, and the tunnel insulating layer pattern 140, may be formed on a channel region 100a of the semiconductor substrate 100.

Figure 7:
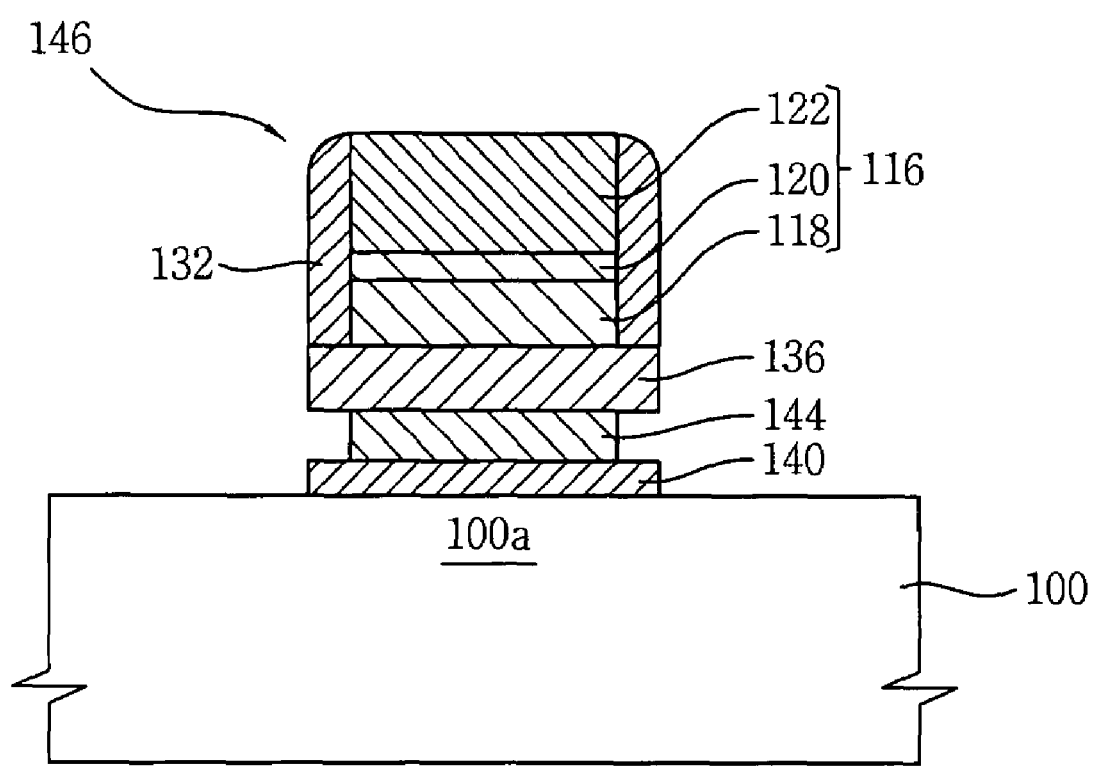

Referring to FIG. 7, sidewalls of the preliminary charge trapping layer pattern 138 may be isotropically etched away to reduce the width of the preliminary charge trapping layer pattern 138. As a result, a charge trapping layer pattern 144 having the reduced width and a gate structure 146 including the charge trapping layer pattern 144 may be formed on the channel region 100a of the semiconductor substrate 100.

The isotropic etching process may be performed to reduce or prevent the likelihood of lateral diffusion of electrons in the charge trapping layer pattern 138. When a high thermal stress is applied to the preliminary gate structure 142, because the preliminary charge trapping layer pattern 138 may have a width wider than that of the control gate electrode 116, electrons trapped in the preliminary charge trapping layer pattern 138 may diffuse into the sidewalls of the preliminary charge trapping layer pattern 138, which may be located beneath the dual spacers 130. The likelihood of lateral diffusion of electrons in the charge trapping layer pattern 144 may be reduced or prevented by removing the sidewalls of the preliminary charge trapping layer pattern 138.

When the preliminary charge trapping layer pattern 138 includes silicon nitride, the sidewalls of the preliminary charge trapping layer pattern 138 may be removed by an etchant including phosphoric acid and water or an etchant including sulfuric acid and water.

When the preliminary charge trapping layer pattern 138 includes a high-k material, the sidewalls of the preliminary charge trapping layer pattern 138 may be removed by an etchant including hydrogen fluoride and water.

While removing the sidewalls of the preliminary charge trapping layer pattern 138, the dielectric layer pattern 136 and the tunnel insulating pattern 140 may be partially removed, and the silicon nitride spacers 134 may be further removed.

The sidewalls of the preliminary charge trapping layer pattern 138 may be removed by a chemical dry etching (CDE) process.

A width ratio of the charge trapping layer pattern 144 having the reduced width to the control gate electrode 116 may be about 0.7 to about 1.1. For example, the reduced width of the charge trapping layer pattern 144 may be substantially the same as the width of the control gate electrode 116.

Referring again to FIG. 1, after forming the charge trapping layer pattern 144, a re-oxidation process may be performed to cure etch damage of the semiconductor substrate 100 and the gate structure 146, which may occur while forming the gate structure 146.

Source/drain regions 148a and 148b may be formed at surface portions of the semiconductor substrate 100 adjacent to the gate structure 146. The source/drain regions 148a and 148b may be formed by an ion implantation process using the gate structure 146 as an ion implantation mask and a heat treatment.

An insulating layer 150 may be formed on the gate structure 146 and the source/drain regions 148a and 148b. The insulating layer 150 may include silicon oxide and may be formed by a CVD process. The insulating layer 150 may be formed to electrically isolate the gate structure 146 and the source/drain regions 148a and 148b from adjacent structures and to further reduce or prevent the likelihood of lateral diffusion of the electrons trapped in the charge trapping layer pattern 144.

In accordance with example embodiments as described above, because the charge trapping layer pattern may have the reduced width even when a high thermal stress is applied to the non-volatile memory device, the likelihood of lateral diffusion of electrons trapped in the charge trapping layer pattern may be reduced or prevented. Thus, the HTS characteristics and reliability of the non-volatile memory device may be improved.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of manufacturing a non-volatile memory device comprising:
    sequentially forming a tunnel insulating layer, a charge trapping layer, a dielectric layer and a conductive layer on a channel region of a substrate;
    patterning the conductive layer to form a gate electrode;
    forming spacers on sidewalls of the gate electrode;
    etching the dielectric layer, the charge trapping layer, and the tunnel insulating layer using the spacers as an etch mask to form a dielectric layer pattern, a charge trapping layer pattern, and a tunnel insulating layer pattern on the channel region; and
    etching sidewalls of the charge trapping layer pattern to reduce a width thereof.

2. The method of claim 1, wherein a ratio of the reduced width of the charge trapping layer pattern to a width of the gate electrode is about 0.7 to about 1.1.

3. The method of claim 2, wherein the reduced width of the charge trapping layer pattern is substantially the same as the width of the gate electrode.

4. The method of claim 1, wherein the charge trapping layer comprises silicon nitride.

5. The method of claim 4, wherein the sidewalls of the charge trapping layer pattern are removed by an etchant comprising phosphoric acid and water or an etchant comprising sulfuric acid and water.

6. The method of claim 1, wherein the charge trapping layer comprises a material having a dielectric constant higher than that of silicon nitride.

7. The method of claim 6, wherein the charge trapping layer comprises any one selected from the group consisting of metal oxide, metal oxynitride, metal silicon oxide, and metal silicon oxynitride.

8. The method of claim 7, wherein the charge trapping layer comprises at least one selected from the group consisting of hafnium(Hf), zirconium(Zr), tantalum(Ta), lanthanum (La), cerium (Ce), praseodymium(Pr), neodymium(Nd), samarium(Sm), europium(Eu), gadolinium(Gd), terbium (Tb), dysprosium(Dy), holmium(Ho), erbium(Er), thulium (Tm), ytterbium(Yb), and lutetium(Lu).

9. The method of claim 6, wherein the sidewalls of the charge trapping layer pattern are removed by an etchant comprising hydrogen fluoride and water.

10. The method of claim 1, wherein the dielectric layer comprises aluminum oxide.

* * * * *